United States Patent
Nakatani et al.

(10) Patent No.: US 6,815,265 B2
(45) Date of Patent: Nov. 9, 2004

(54) METHOD OF FABRICATING A SEMICONDUCTOR DEVICE WITH A PASSIVATION FILM

(75) Inventors: Shinya Nakatani, Hyogo (JP); Heiji Kobayashi, Hyogo (JP)

(73) Assignees: Renesas Technology Corp., Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 10/202,042

(22) Filed: Jul. 25, 2002

(65) Prior Publication Data

US 2003/0146514 A1 Aug. 7, 2003

(30) Foreign Application Priority Data

Feb. 1, 2002 (JP) ........................... 2002-025015

(51) Int. Cl.⁷ .............................................. H01L 21/82
(52) U.S. Cl. ...................... 438/132; 257/529; 257/643; 257/758; 438/622; 438/725
(58) Field of Search ................................ 257/529, 643, 257/758; 438/132, 622, 725, 82, 215, 281, 333

(56) References Cited

U.S. PATENT DOCUMENTS 4,928,161 A * 5/1990 Kobayashi ................... 257/60
5,508,540 A * 4/1996 Ikeda et al. ................ 257/298
6,291,837 B1 * 9/2001 Nakajima et al. ............ 257/57
6,294,474 B1 * 9/2001 Tzeng et al. ................ 438/710
6,372,554 B1 * 4/2002 Kawakita et al. ........... 438/132

FOREIGN PATENT DOCUMENTS

JP          2000077677 A  *  3/2000  ......... H01L/29/786

\* cited by examiner

*Primary Examiner*—Allan R. Wilson
(74) *Attorney, Agent, or Firm*—McDermott, Will & Emery LLP (57) ABSTRACT

An uppermost interlayer isolation film is provided on a semiconductor substrate. An uppermost wire is provided on the uppermost interlayer isolation film. A silicon oxide film is provided to cover the upper surface and the side wall of the uppermost wire. A nitride film is provided on the uppermost interlayer isolation film to cover the uppermost wire through the silicon oxide film. A polyimide film is provided on the nitride film. A portion of the uppermost interlayer isolation film other than a portion located under the uppermost wire is downwardly scooped. The nitride film covers the scooped portion of the uppermost interlayer isolation film. According to the present invention, a semiconductor device improved to be capable of improving coverage of a silicon nitride passivation film is obtained.

5 Claims, 9 Drawing Sheets

METHOD OF FABRICATING A SEMICONDUCTOR DEVICE WITH A PASSIVATION FILM

BACKGROUND OF THE INVENTION

1. Field of the Invention

The present invention generally relates to a semiconductor device, and more specifically, it relates to a semiconductor device having a passivation film relieved of stress applied to wiring capacity and a wire. The present invention also relates to a method of fabricating such a semiconductor device.

2. Description of the Background Art

In order to protect a semiconductor device, a passivation film is formed on the surface of the semiconductor device.

In general, a two-layer passivation film of $SiO_2$ and SiN is employed for relaxing stress applied to wiring capacity and a wire.

A method of fabricating a semiconductor device employing such a two-layer passivation film is now described.

Figure 11:
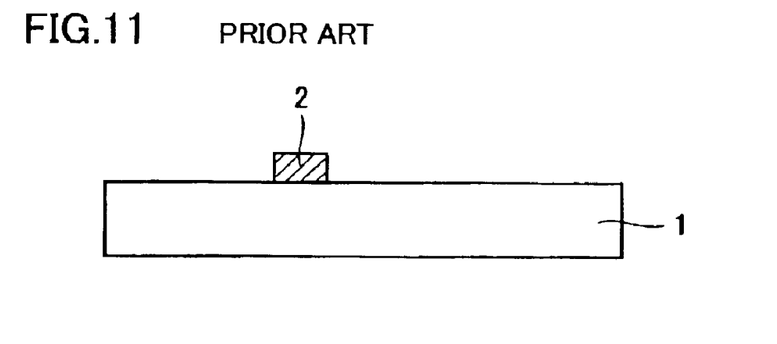
FIGS. 11 to 17 are sectional views showing first to seventh steps in a conventional method of fabricating a semiconductor device.

Referring to FIG. 11, a fuse 2 is formed on a semiconductor substrate 1. The fuse 2 is employed for redundancy of a memory cell, for example. The function of this fuse 2 is described later. The fuse 2 is made of polysilicon or Al.

Figure 12:
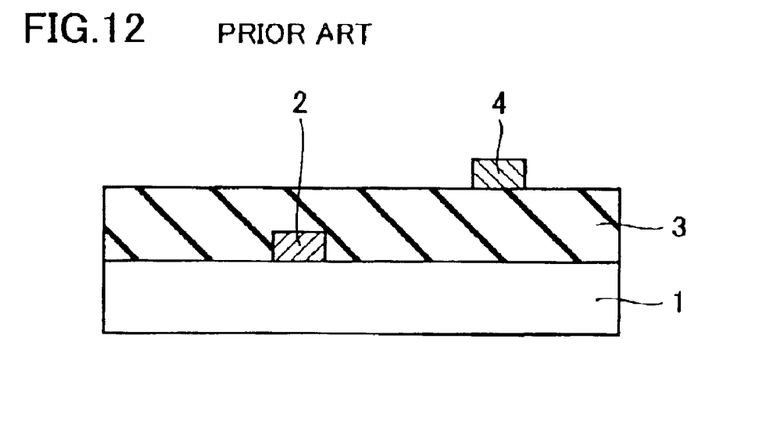

Referring to FIG. 12, an uppermost interlayer isolation film 3 is formed on the semiconductor substrate 1 to cover the fuse 2. An uppermost wire 4 of a bimetal is formed on the uppermost interlayer isolation film 3.

Figure 13:
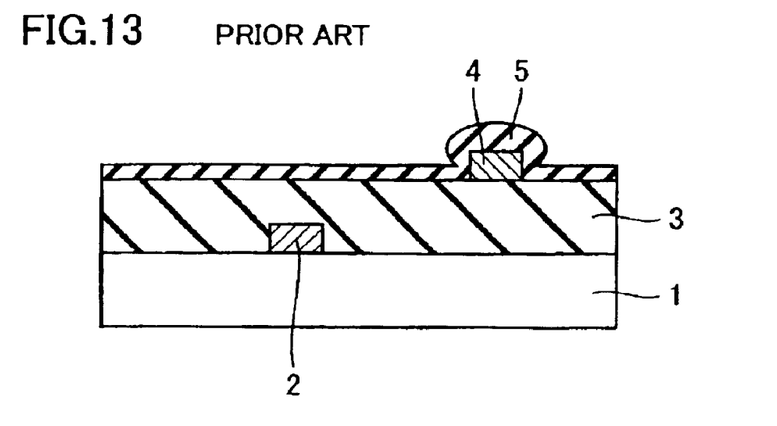

Referring to FIG. 13, a silicon oxide film 5 is formed on the uppermost interlayer isolation film 3 by a plasma method to cover the uppermost wire 4. The plasma method is employed since the uppermost wire 4 is dissolved due to a high temperature if the silicon oxide film 5 is formed by a method other than the plasma method. Therefore, only the plasma method can be employed for forming the silicon oxide film 5 in this case.

Figure 14:
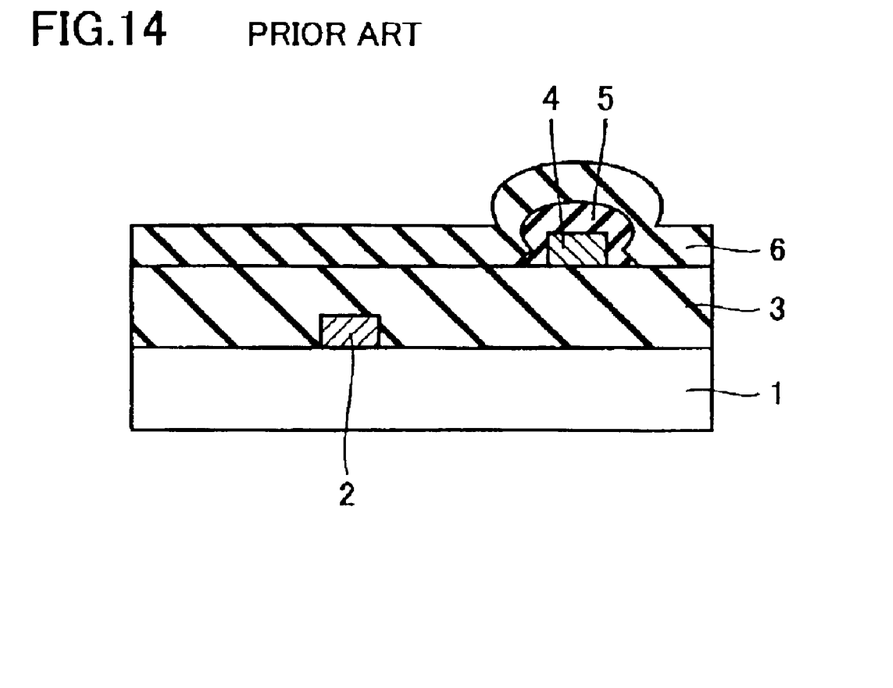

Referring to FIGS. 13 and 14, the silicon oxide film 5 is etched back and partially left only on the side walls and the upper surface of the uppermost wire 4. Thereafter a nitride film 6 is formed on the semiconductor substrate 1.

Figure 15:
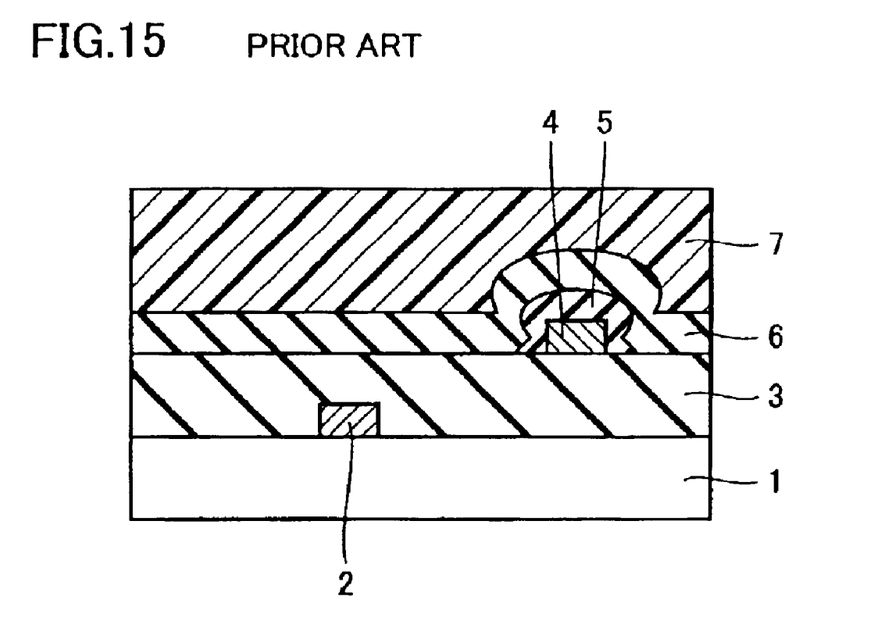

Referring to FIG. 15, a polyimide film 7 is formed on the nitride film 6.

Figure 16:
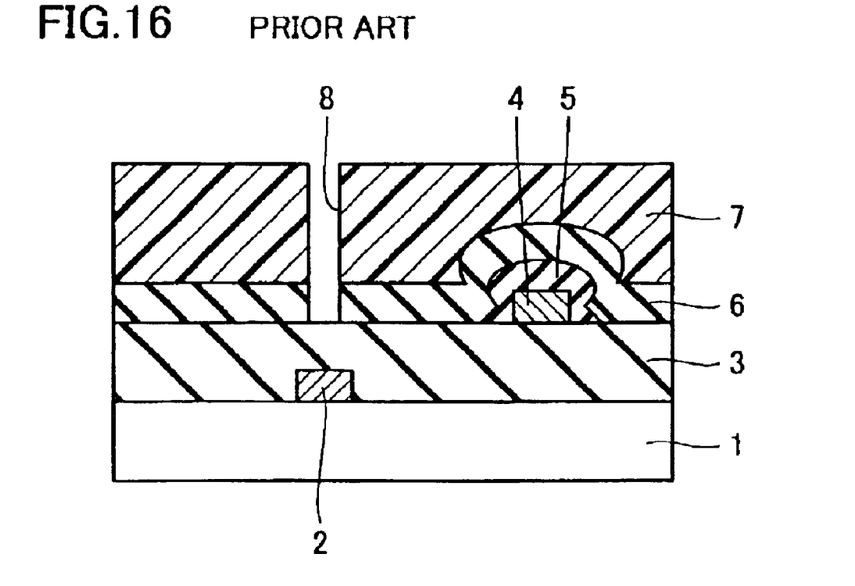

Referring to FIG. 16, the fuse 2 is cut by laser blowing, and hence the portion of the uppermost interlayer isolation film 3 located on the fuse 2 must be reduced in thickness.

Therefore, a hole 8 for introducing a laser beam is formed to pass through portions of the polyimide film 7 and the nitride film 6 located above the fuse 2, as shown in FIG. 16.

Figure 17:
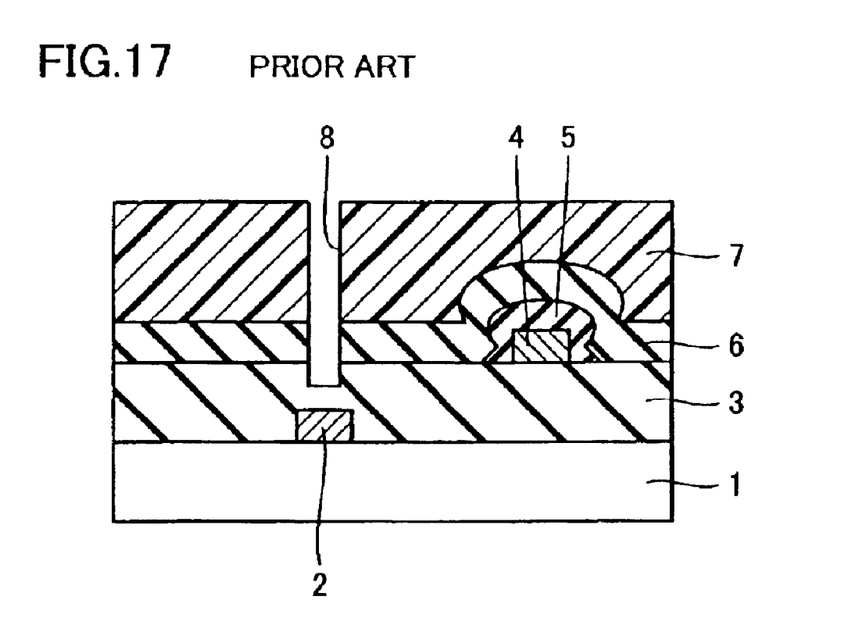

Referring to FIG. 17, the surface of the uppermost interlayer isolation film 3 is partially etched through the hole 8 for optimizing the thickness of the portion of the uppermost interlayer isolation film 3 located on the fuse 2. Thereafter the fuse 2 is cut by laser blowing, thereby completing the semiconductor device.

Figure 18:
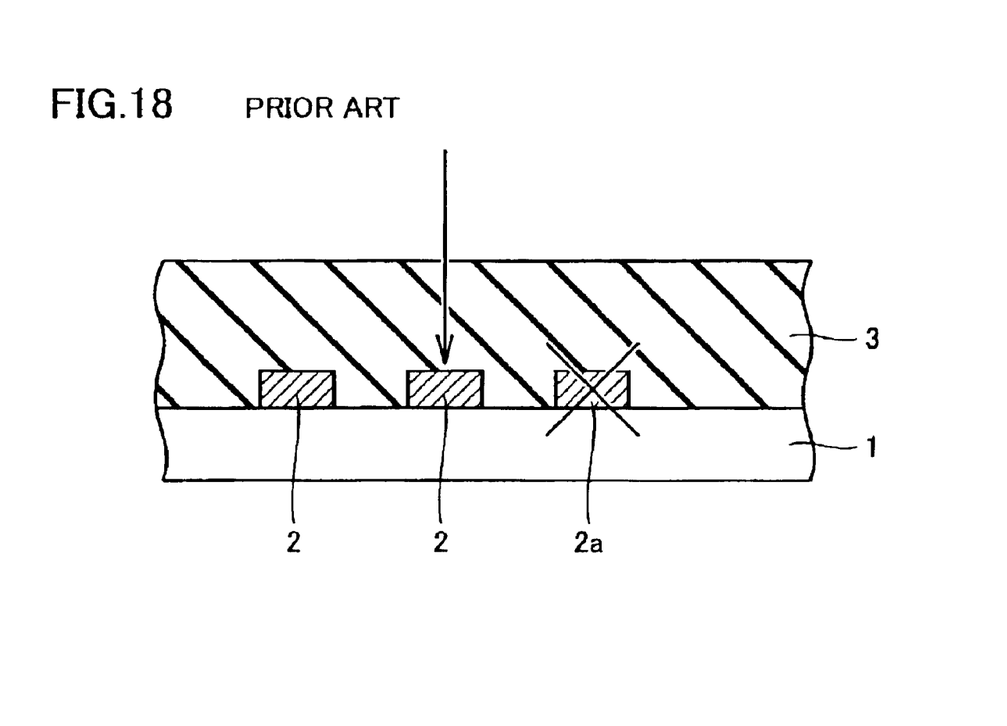
FIG. 18 illustrates a problem caused when the thickness of a portion of an uppermost interlayer isolation film located on a fuse is not optimized.

FIG. 18 illustrates a problem caused when the thickness of the portion of the uppermost interlayer isolation film 3 located on the fuse 2 is not optimized. If the thickness of the portion of the uppermost interlayer isolation film 3 located on the fuse 2 is left intact, the laser beam for cutting the fuse 2 is so increased in energy that the same disadvantageously cuts an adjacent fuse 2a not to be cut, leading to a failure in formation of the target semiconductor device. Therefore, the thickness of the portion of the uppermost interlayer isolation film 3 located on the fuse 2 must be reduced and optimized.

The conventional semiconductor device including the fuse 2 is fabricated in the aforementioned manner.

Referring again to FIG. 13, the nitride film 6 is formed by plasma CVD (chemical vapor deposition), disadvantageously leading to inferior coverage.

Figure 19:
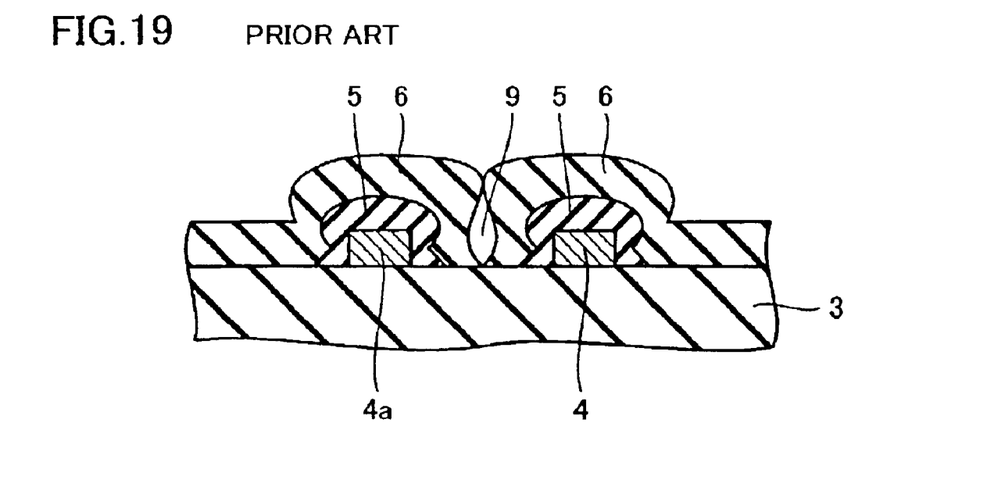
FIG. 19 illustrates a problem in the conventional method of fabricating a semiconductor device.

When the uppermost wire 4 is formed adjacently to another uppermost wire 4a as shown in FIG. 19 and the nitride film 6 is formed by plasma CVD, a cavity 9 is defined due to inferior coverage to disadvantageously reduce the reliability of the semiconductor device.

SUMMARY OF THE INVENTION

The present invention has been proposed in order to solve the aforementioned problem, and an object thereof is to provide a method of fabricating a semiconductor device improved to be capable of forming a nitride film on an uppermost wire with excellent coverage.

Another object of the present invention is to provide a highly reliable method of fabricating a semiconductor device through the same number of steps as the prior art with no requirement for additional steps.

Still another object of the present invention is to provide a method of fabricating a semiconductor device improved to be capable of optimizing the thickness of a portion of an uppermost interlayer isolation film located on a fuse with no requirement for additional steps.

A further object of the present invention is to provide a highly reliable semiconductor device obtained by such a method.

A semiconductor device according to a first aspect of the present invention comprises a semiconductor substrate. An uppermost interlayer isolation film is provided on the aforementioned semiconductor substrate. An uppermost wire is provided on the aforementioned uppermost interlayer isolation film. A silicon oxide film is provided to cover the upper surface and the side wall of the aforementioned uppermost wire. A nitride film is provided on the aforementioned uppermost interlayer isolation film to cover the aforementioned uppermost wire through the aforementioned silicon oxide film. A polyimide film is provided on the aforementioned nitride film. A portion of the aforementioned uppermost interlayer isolation film other than portions located under the aforementioned uppermost wire and on the side wall of the aforementioned silicon oxide film is downwardly scooped. The aforementioned nitride film covers the scooped portion of the aforementioned uppermost interlayer isolation film.

In a method of fabricating a semiconductor device according to a second aspect of the present invention, an uppermost interlayer isolation film of $SiO_2$ is first formed on a semiconductor substrate. An uppermost wire is formed on the aforementioned uppermost interlayer isolation film. A silicon oxide film is formed on the aforementioned uppermost interlayer isolation film by a plasma method, to cover the aforementioned uppermost wire. The aforementioned silicon oxide film is etched back for downwardly scooping a portion of the aforementioned uppermost interlayer isolation film other than portions located under the aforementioned uppermost wire and on the side wall of the aforementioned silicon oxide film. A nitride film is formed on the aforementioned uppermost interlayer isolation film to cover the surface of the aforementioned scooped portion. A polyimide film is formed on the aforementioned nitride film.

The foregoing and other objects, features, aspects and advantages of the present invention will become more

DESCRIPTION OF THE PREFERRED EMBODIMENTS

Embodiments of the present invention are now described.

First Embodiment

Figure 1:
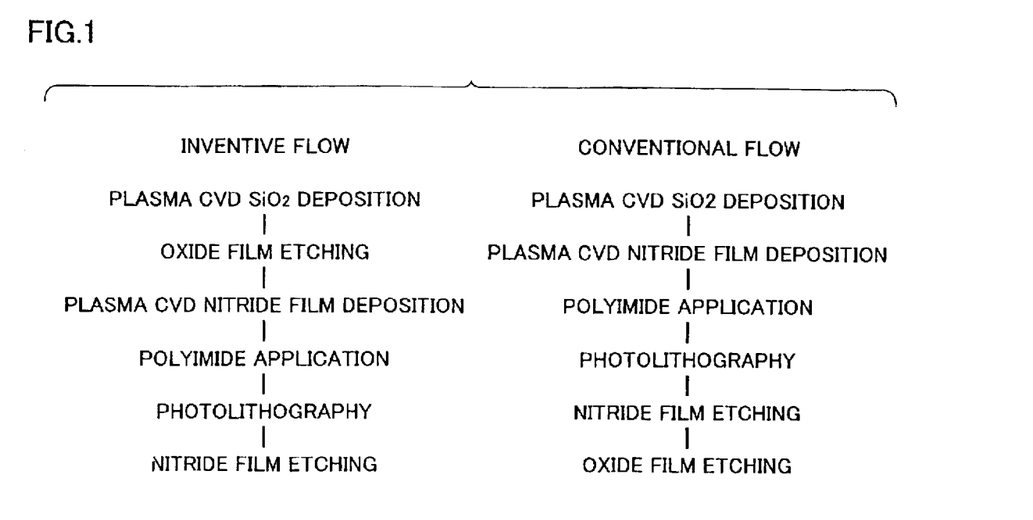
FIG. 1 shows a flow according to the present invention and a flow according to the prior art in comparison with each other.

FIG. 1 illustrates a flow according to the present invention and a conventional flow in comparison with each other. In the inventive flow, an oxide film etching step is inserted between a plasma CVD $SiO_2$ deposition step and a plasma CVD nitride film deposition step, dissimilarly to the conventional flow.

A first embodiment of the present invention is now specifically described with reference to FIGS. 2 to 6.

Figure 2:
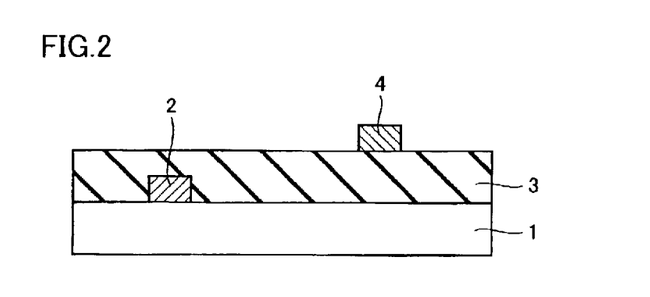
FIGS. 2 to 6 are sectional views showing first to fifth steps in a method of fabricating a semiconductor device according to a first embodiment of the present invention.

Referring to FIG. 2, a fuse 2 is formed on a semiconductor substrate 1. An uppermost interlayer isolation film 3 of $SiO_2$ is formed on the semiconductor substrate 1 to cover the fuse 2. An uppermost wire 4 is formed on the uppermost interlayer isolation film 3.

Figure 3:
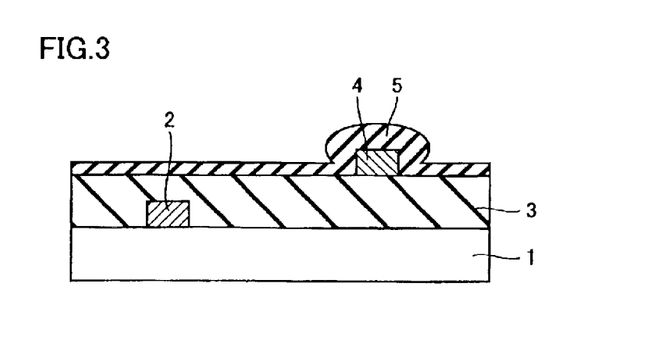

Referring to FIG. 3, a silicon oxide film 5 is formed on the uppermost interlayer isolation film 3 by plasma CVD, to cover the uppermost wire 4.

Figure 4:
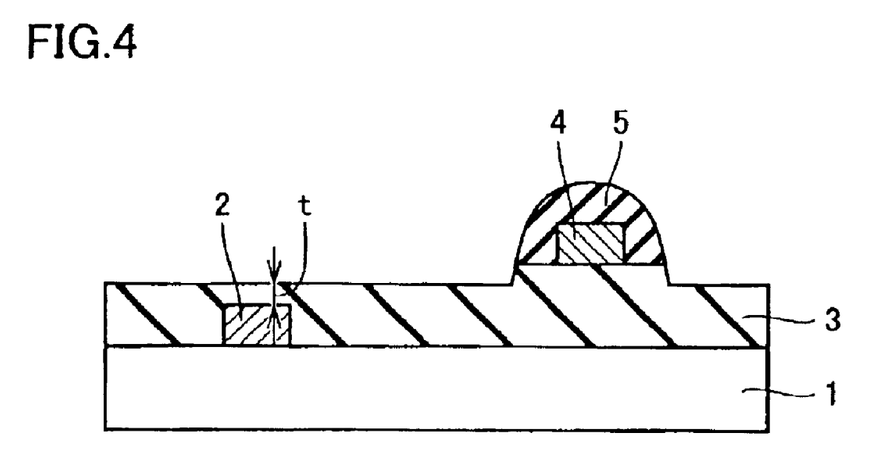

Referring to FIGS. 3 and 4, the silicon oxide film 5 is etched back. At this time, the silicon oxide film 5 is so etched back as to downwardly scoop a potion of the uppermost interlayer isolation film 3 other than that located under the uppermost wire 4. This etching is so performed as to optimize the thickness t of the portion of the uppermost interlayer isolation film 3 located on the fuse 2. The shapes of the shoulder portions of the silicon oxide film 5 are smoothed due to the effect of this etching.

Figure 5:
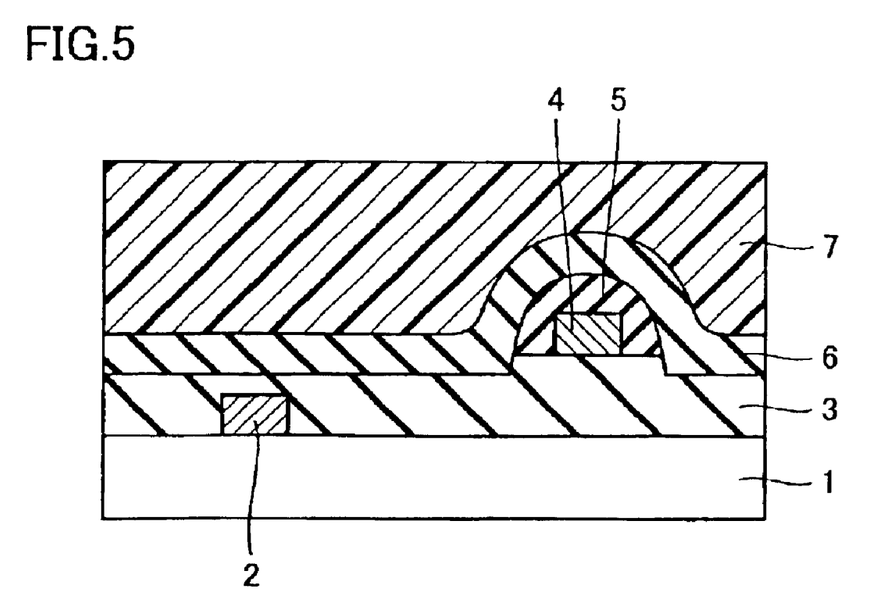

Referring to FIG. 5, a nitride film 6 is deposited on the uppermost interlayer isolation film 3 by plasma CVD, to cover the surface of the scooped portion. At this time, the nitride film 6 is formed on the uppermost interlayer isolation film 3 with excellent coverage due to the smoothed shapes of the shoulder portions of the silicon oxide film 5. A polyimide film 7 is formed on the nitride film 6.

Figure 6:
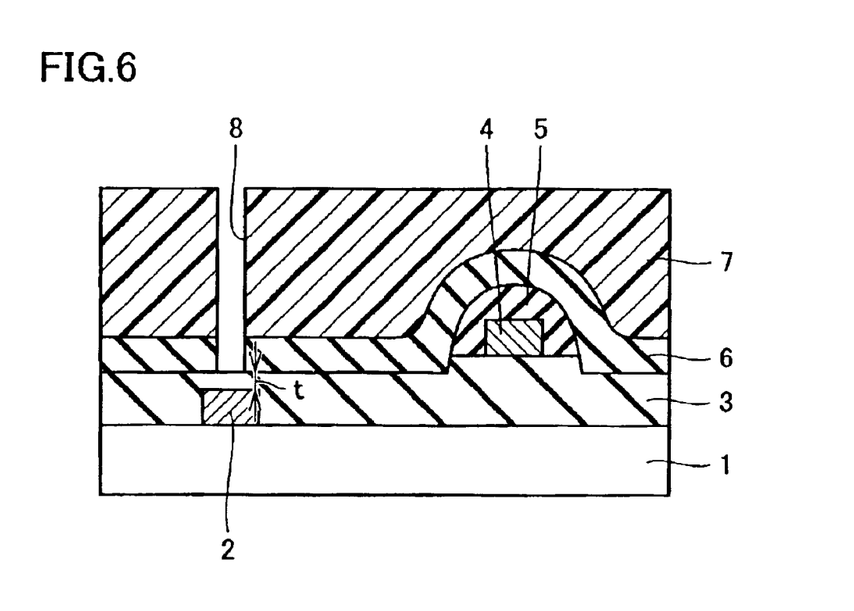

Referring to FIG. 6, portions of the nitride film 6 and the polyimide film 7 located on the fuse 2 are removed by etching, for forming a hole 3. The thickness t of the portion of the uppermost interlayer isolation film 3 located on the fuse 2 is optimized, and hence this portion of the uppermost interlayer isolation film 3 may not be etched.

Then, the fuse 2 is laser-blown through the hole 8, thereby completing a semiconductor device.

Second Embodiment

Figure 7:
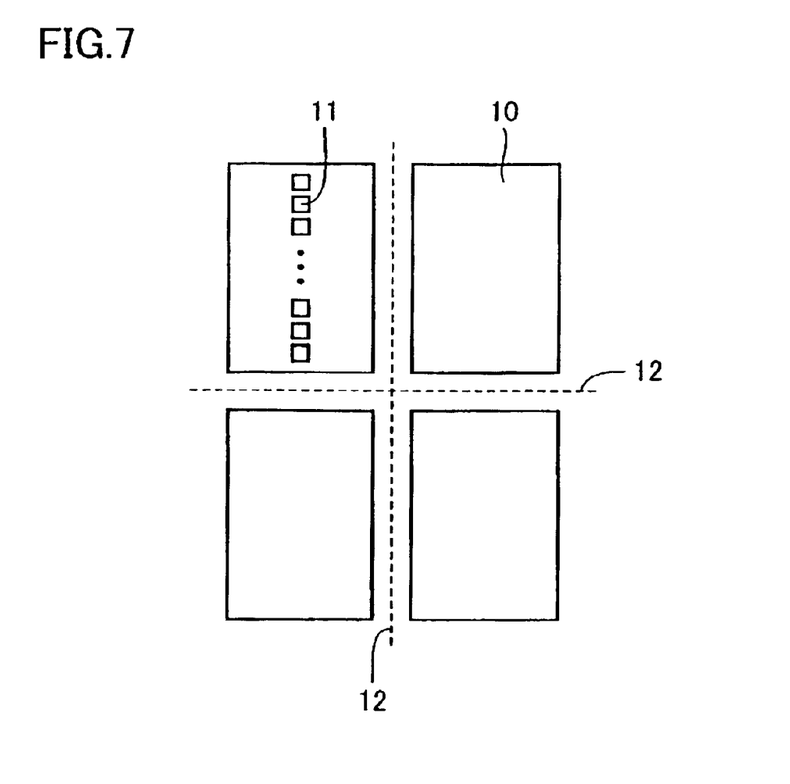
FIG. 7 is a plan view of a semiconductor device according to a second embodiment of the present invention.

FIG. 7 is a plan view of a semiconductor device according to a second embodiment of the present invention. The semiconductor device according to this embodiment comprises a chip 10 and a pad 11. Dicing lines 12 are provided on a semiconductor substrate.

Figure 8:
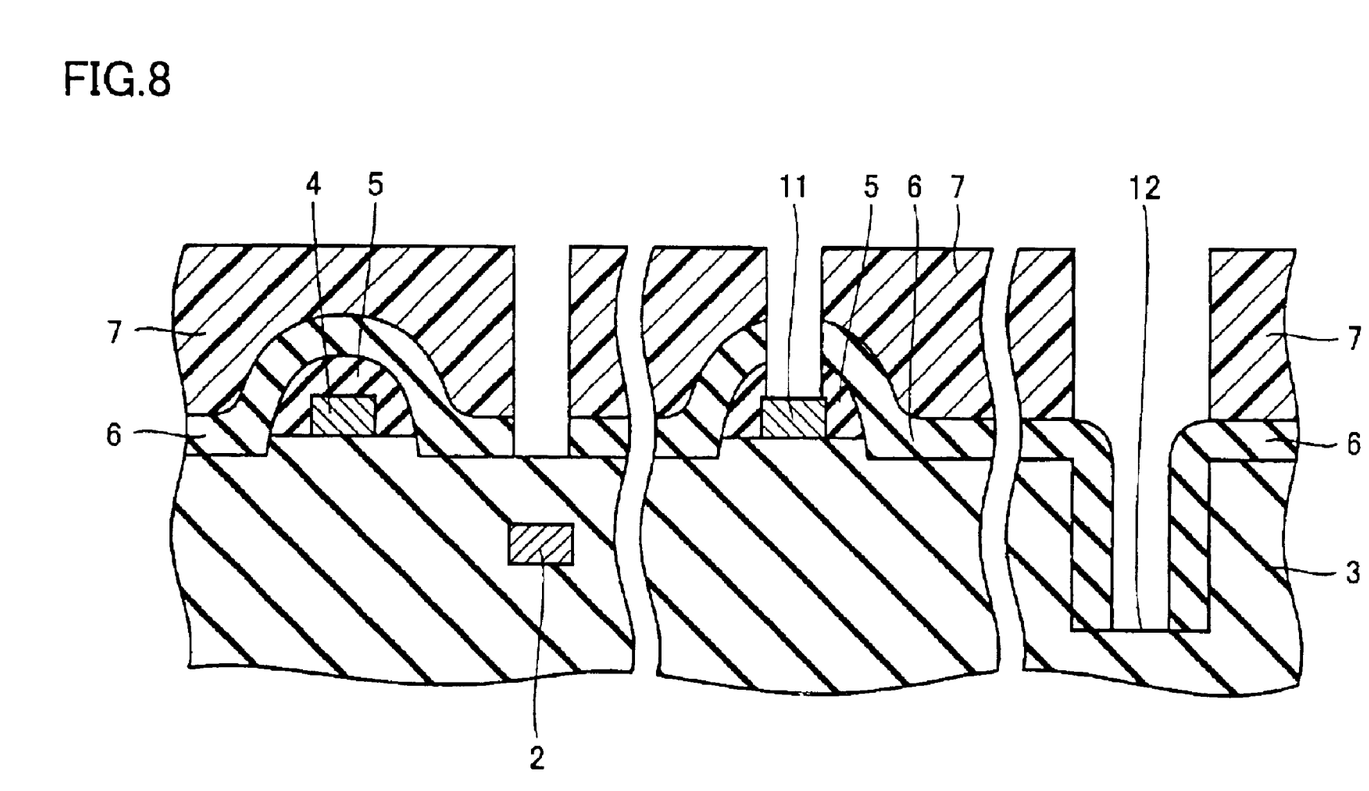
FIG. 8 illustrates a fuse, a pad and a dicing line in the semiconductor device according to the second embodiment of the present invention.

A method of fabricating the semiconductor device according to this embodiment further comprises a step of forming the pad 11 and the dicing lines 12 on the semiconductor substrate. In a step similar to that shown in FIG. 6, portions of a nitride film 6 and a polyimide film 7 located on a fuse 2 are removed by etching. At this time, portions of the nitride film 6 and the polyimide film 7 located on the pad 11 and on the dicing lines 12 are removed by etching while simultaneously removing the portions of the nitride film 6 and the polyimide film 7 located on the fuse 2 by etching. Then, an electrode is connected to the pad 11, and dicing is performed through the dicing lines 12. The fuse 2 is cut by laser blowing. Thus, a semiconductor chip is completed.

Third Embodiment

Figure 9:
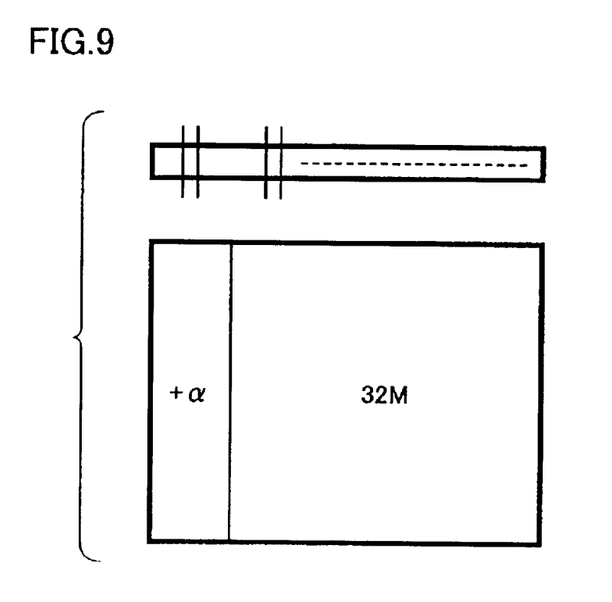
FIGS. 9 and 10 are first and second diagrams for illustrating a function of a fuse according to a third embodiment of the present invention.

FIG. 9 is a diagram for illustrating a function of a fuse according to a third embodiment of the present invention. Referring to FIG. 9, extra memory cells are prepared by α when forming a memory cell array having capacity of 32 M.

Figure 10:
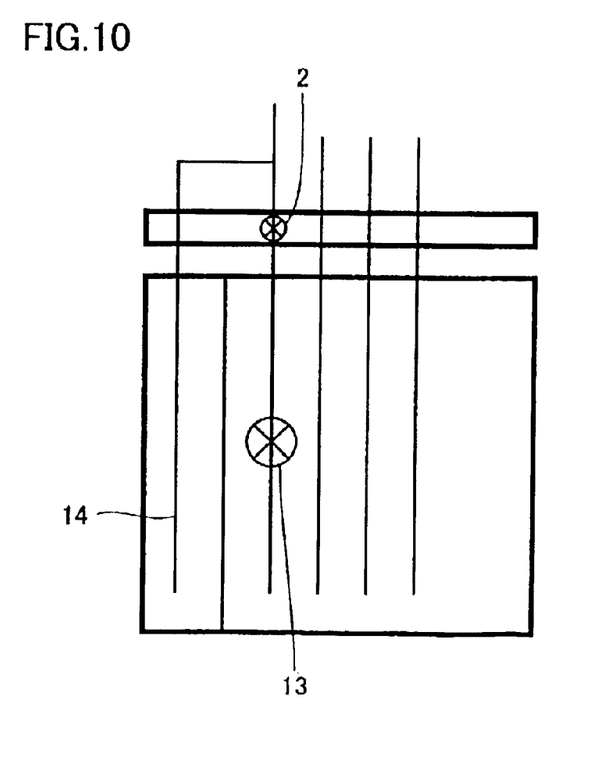

Referring to FIG. 10, it is assumed that a memory cell 13 fails. In this case, a fuse 2 connected to the failing memory cell 13 is cut by laser blowing. A data line is connected to an additionally prepared redundancy memory cell 14. Thus, the chip is not entirely rendered defective by the failure of the memory cell 13. Consequently, the yield is effectively improved.

According to the present invention, as hereinabove described, coverage of a silicon nitride passivation film can be improved while the thickness of a portion of an interlayer isolation film located on a fuse can be controlled.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device, comprising the sequential steps of:

forming an uppermost interlayer isolation film of $SiO_2$ on a semiconductor substrate; forming an uppermost wire, having an upper surface and side surfaces, on an upper surface of said uppermost interlayer isolation film;

forming a silicon oxide film on said uppermost interlayer isolation film by a plasma method to cover said uppermost wire;

etching said silicon oxide film to form an etched back film of silicon oxide covering the upper surface and side surfaces of said uppermost wire and continuing etching to remove a portion of the upper surface of said uppermost interlayer isolation film not located under said uppermost wire and not under the etched back silicon oxide film;

forming a nitride film on said uppermost interlayer isolation film to cover the etched interlayer isolation film; and forming a polyimide film on said nitride film.

2. The method of fabricating a semiconductor device according to claim 1, further comprising a step of forming a fuse on said semiconductor substrate in advance of said step of forming said uppermost interlayer isolation film, wherein said uppermost interlayer isolation film is formed to cover said fuse.

3. The method of fabricating a semiconductor device according to claim 2, further comprising a step of removing portions of said nitride film and said polyimide film located on said fuse by etching.

4. The method of fabricating a semiconductor device according to claim 2, comprising conducting said etching to optimize the thickness of a portion of said uppermost interlayer isolation film located on said fuse.

5. The method of fabricating a semiconductor device according to claim 4, further comprising a step of forming a pad and a dicing line on said semiconductor substrate, and further comprising etching to simultaneously remove portions of said nitride film and said polyimide film located on said pad, on said fuse and on said dicing line.

* * * * *